US 6,996,021 B2

(12) United States Patent
Derner et al.

(10) Patent No.: US 6,996,021 B2
(45) Date of Patent: Feb. 7, 2006

(54) ROM EMBEDDED DRAM WITH BIAS SENSING

(75) Inventors: Scott Derner, Meridian, ID (US); Casey Kurth, Eagle, ID (US); Phillip G. Wald, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 88 days.

(21) Appl. No.: 10/899,894

(22) Filed: Jul. 27, 2004

(65) Prior Publication Data

US 2004/0264258 A1 Dec. 30, 2004

Related U.S. Application Data

(60) Continuation of application No. 10/376,769, filed on Feb. 28, 2003, now Pat. No. 6,788,603, which is a division of application No. 10/020,371, filed on Dec. 12, 2001, now Pat. No. 6,545,899.

(51) Int. Cl.
  *G11C 7/02* (2006.01)

(52) U.S. Cl. .......................................... 365/210; 365/94
(58) Field of Classification Search ................. 365/210, 365/94, 102, 149, 203, 207
See application file for complete search history.

(56) References Cited

U.S. PATENT DOCUMENTS

| 4,575,819 A | 3/1986 | Amin |
| 4,855,803 A | 8/1989 | Azumai et al. |
| 5,053,648 A | 10/1991 | van den Elshout et al. |
| 5,148,391 A | 9/1992 | Zagar |
| 5,226,014 A | 7/1993 | McManus |
| 5,270,241 A | 12/1993 | Dennison et al. |
| 5,311,464 A | 5/1994 | Takase et al. |
| 5,351,213 A | 9/1994 | Nakashima |
| 5,388,076 A | 2/1995 | Ihara |
| 5,418,739 A | * 5/1995 | Takasugi ..................... 365/149 |
| 5,440,506 A | 8/1995 | Longway |
| 5,526,302 A | * 6/1996 | Takasugi ..................... 365/149 |
| 5,732,013 A | 3/1998 | Von Basse et al. |
| 5,757,690 A | 5/1998 | McMahon |
| 5,831,892 A | 11/1998 | Thewes et al. |
| 5,900,008 A | 5/1999 | Akao et al. |
| 5,917,744 A | 6/1999 | Kirihata et al. |
| 5,923,582 A | 7/1999 | Voss |
| 5,961,653 A | 10/1999 | Kalter et al. |
| 5,966,315 A | 10/1999 | Muller et al. |
| 5,982,682 A | 11/1999 | Nevill et al. |
| 5,995,409 A | 11/1999 | Holland |
| 6,134,137 A | 10/2000 | Kurth et al. |
| 6,154,864 A | 11/2000 | Merritt |
| 6,243,285 B1 | 6/2001 | Kurth et al. |

* cited by examiner

*Primary Examiner*—Anh Phung
(74) *Attorney, Agent, or Firm*—Leffert Jay & Polglaze, P.A.

(57) ABSTRACT

A ROM embedded DRAM that provides ROM cells that can be programmed to a single state. Bias techniques are used to read un-programmed ROM cells accurately. Sense amplifier circuitry can be offset in one embodiment to default to the un-programmed state. In another embodiment, bias circuitry is coupled to bit lines to favor the un-programmed state. Further, a differential pre-charge operation can also be used in another embodiment. The ROM embedded DRAM allows for simplifier fabrication and programming of the ROM cells, while providing accurate dual state functionality.

10 Claims, 7 Drawing Sheets

ROM EMBEDDED DRAM WITH BIAS SENSING

RELATED APPLICATION

This is a continuation application of U.S. patent application Ser. No. 10/376,769, filed Feb. 28, 2003 (now U.S. Pat. No. 6,788,603), which is a divisional application of U.S. patent application Ser. No. 10/020,371 (now U.S. Pat. No. 6,545,899), filed Dec. 12, 2001, titled "ROM EMBEDDED DRAM WITH BIAS SENSING" and commonly assigned, the entire contents of which are incorporated herein by reference.

TECHNICAL FIELD OF THE INVENTION

The present invention relates generally to memory devices and in particular the present invention relates to read only memory (ROM) embedded in a dynamic random access memory (DRAM).

BACKGROUND OF THE INVENTION

Semiconductor memory systems are comprised of two basic elements: memory storage areas and memory control areas. DRAM, for example, includes a memory cell array, which stores information, and peripheral circuitry, which controls the operation of the memory cell array.

DRAM arrays are manufactured by replicating millions of identical circuit elements, known as DRAM cells, on a single semiconductor wafer. A DRAM cell is an addressable location that can store one bit (binary digit) of data. In its most common form, a DRAM cell consists of two circuit components: a storage capacitor and an access field effect transistor. The capacitor holds the value of each cell, namely a "1" or a "0," as a charge on the capacitor. Because the charge on a capacitor gradually leaks away, DRAM capacitors must be refreshed on a regular basis. A memory device incorporating a DRAM memory includes logic to refresh (recharge) the capacitors of the cells periodically or the information will be lost. Reading the stored data in a cell and then writing the data back into the cell at a predefined voltage level refreshes a cell. The required refreshing operation is what makes DRAM memory dynamic rather than static.

The transistor of a DRAM cell is a switch to let control circuitry for the RAM either read the capacitor value or to change its state. The transistor is controlled by a row line coupled to its gate connection. In a read operation, the transistor is activated and sense amplifiers coupled to bit lines (column) determine the level of charge stored in the memory cell capacitor, and reads the charge out as either a "1" or a "0" depending upon the level of charge in the capacitor. In a write operation, the sense amplifier is overpowered and the memory cell capacitor is charged to an appropriate level.

Frequently, as in the case of microprocessors, microcontrollers, and other application specific integrated circuitry (ASICs), it is desired to incorporate read only memory (ROM) together with or in addition to RAM on a single semiconductor wafer. This typically requires the formation of separate additional peripheral circuitry and interconnects for the ROM. The ROM cells and additional circuitry require additional semiconductor wafer space and fabrication process steps that increase the overall costs of device fabrication.

A read only memory (ROM) consists of an array of semiconductor devices (diodes, bipolar or field-effect transistors), which interconnect to store an array of binary data (ones or zeros). A ROM basically consists of a memory array of programmed data and a decoder to select the data located at a desired address in the memory array.

Three basic types of ROMs are mask-programmable ROMs, erasable programmable ROMs (EPROMs) and field-programmable ROMs (PROMs). The data array is permanently stored in a mask-programmable ROM, at the time of manufacture, by selectively including or omitting the switching elements at the row-column intersections in the memory array. This requires a special mask used during fabrication of the integrated circuit, which is expensive and feasible only when a large quantity of the same data array is required. EPROMs use a special charge-storage mechanism to enable or disable the switching elements in the memory array. In this case, appropriate voltage pulses to store electrical charges at the memory array locations are provided. The data stored in this manner is generally permanent until it is erased using ultraviolet light allowing it to once again be programmed. PROMs are typically manufactured with all switching elements present in the array, with the connection at each row-column intersection being made by means of either a fuse element or an anti-fuse element. In order to store data in the PROM, these elements (either the fuse or the anti-fuse, whichever are used in the design) are selectively programmed using appropriate voltage pulses supplied by a PROM programmer. Once the elements are programmed, the data is permanently stored in the memory array.

Programmable links have been used extensively in programmable read only memory (PROM) devices. Probably the most common form of programmable link is a fusible link. When a user receives a PROM device from a manufacturer, it usually consists of an X-Y matrix or lattice of conductors or semiconductors. At each cross-over point of the lattice a conducting link, call a fusible link, connects a transistor or other electronic node to this lattice network. The PROM is programmed by blowing the fusible links to selected nodes and creating an open circuit. The combination of blown and unblown links represents a digital bit pattern of ones and zeros signifying data that the user wishes to store in the PROM. By providing an address the data stored on a node may be retrieved during a read operation.

In recent years, a second type of programmable link, call an anti-fuse link, has been developed for use in integrated circuit applications. Instead of the programming mechanism causing an open circuit as in the case with fusible links, the programming mechanism in an anti-fuse circuit creates a short circuit or relatively low resistance link. Thus the anti-fuse link presents an open circuit prior to programming and a low resistance connection after programming. Anti-fuse links consist of two electrodes comprised of conductive and/or semiconductive materials and having some kind of a dielectric or insulating material between them. During programming, the dielectric in between the conductive materials is broken down by predetermined applied voltages, thereby electrically connecting the conducting and/or semiconducting materials together.

Like RAM cells, ROM cells need to store either a data 1 or a data 0. Processing factors, however, may limit the ROM cell to only one program state. For the reasons stated above, and for other reasons stated below which will become apparent to those skilled in the art upon reading and understanding the present specification, there is a need in the art for a ROM-embedded-DRAM which can be fabricated with single state ROM cells.

SUMMARY OF THE INVENTION

The above-mentioned problems with ROM embedded DRAM's and other problems are addressed by the present invention and will be understood by reading and studying the following specification.

In one embodiment, a memory device comprises a plurality of memory cell capacitors. A portion of the plurality of memory cell capacitors is programmed in a non-volatile manner to a first data state. Digit lines are selectively couplable to the plurality of memory cell capacitors, and sense circuitry is coupled to the digit lines. The sense circuitry is biased to detect a second data state in an absence of a programmed memory cell capacitor coupled to the digit lines.

A read only memory (ROM) embedded dynamic random access memory (DRAM) device comprises a plurality of DRAM cell capacitors programmed as ROM cells in a non-volatile manner to a first data state. Sense circuitry is coupled to first and second digit lines. The sense circuitry is biased to detect a second data state on the first digit line in an absence of a programmed memory cell capacitor coupled to the first digit line.

In another embodiment, a memory device comprises a plurality of memory cell capacitors, wherein a portion of the plurality of memory cell capacitors is programmed in a non-volatile manner to a first data state. Digit lines are selectively couplable to the plurality of memory cell capacitors, and sense circuitry is coupled to the digit lines. A reference cell is coupled to the sense circuitry to force a detection of a second data state in an absence of a programmed memory cell capacitor coupled to the digit lines.

A read only memory (ROM) embedded dynamic random access memory (DRAM) device comprises a plurality of DRAM cell capacitors programmed as ROM cells in a non-volatile manner to a first data state. Sense circuitry is coupled to first and second digit lines, and a reference cell is coupled to the sense circuitry to force a detection of a second data state in an absence of a programmed memory cell capacitor coupled to the digit lines.

In another embodiment, a memory device comprises a plurality of memory cell capacitors programmed in a non-volatile manner to a first data state, and a bias circuit coupled to the sense circuitry to force a detection of a second data state in an absence of a programmed memory cell capacitor coupled to digit lines.

In yet another embodiment, a read only memory (ROM) embedded dynamic random access memory (DRAM) device comprises a plurality of DRAM cell capacitors programmed as ROM cells in a non-volatile manner to a first data state. A bias circuit is coupled to sense circuitry to force a detection of a second data state in an absence of a programmed memory cell capacitor coupled to digit lines.

DETAILED DESCRIPTION OF THE INVENTION

Figure 1:
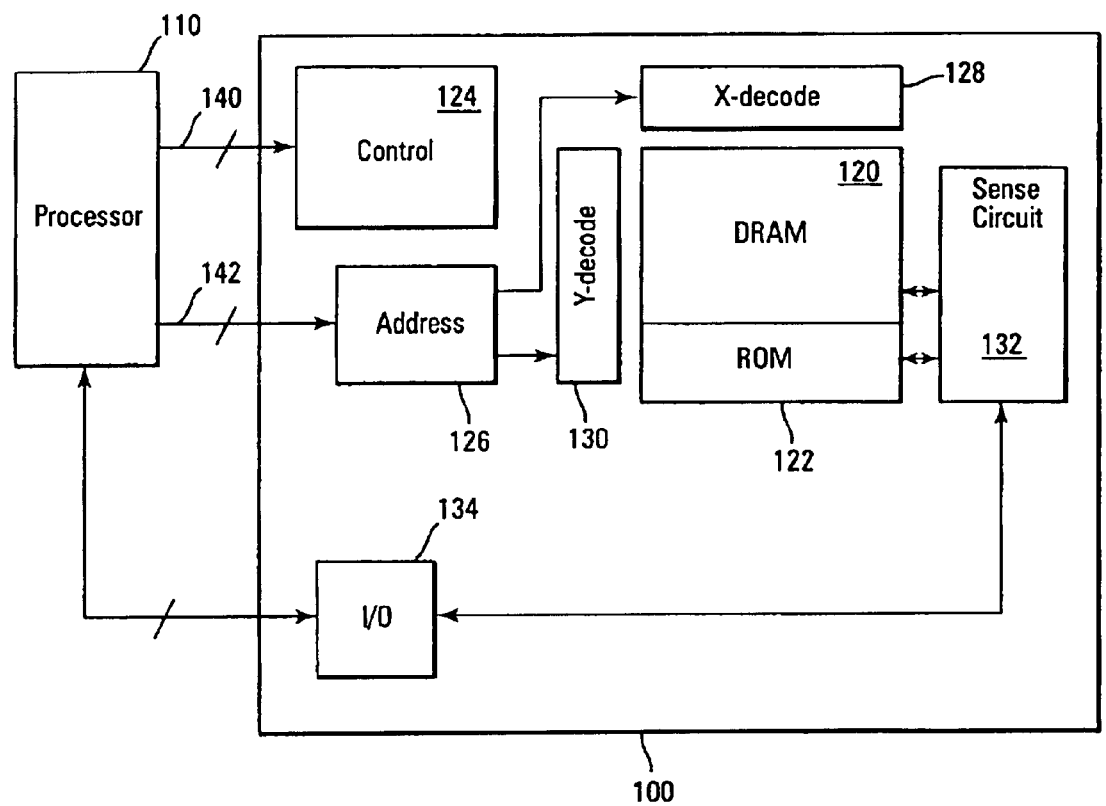
FIG. 1 is a simplified block diagram of a memory of an embodiment of the present invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

Referring to FIG. 1, a simplified block diagram of a ROM embedded DRAM 100 of one embodiment of the present invention is described. The memory device can be coupled to a processor 110 for bi-directional data communication. The memory includes an array of memory cells 112. The array includes a dynamic (DRAM) portion 120 and a read only (ROM) portion 122. The ROM array is "embedded" in the dynamic memory and may include some dynamic cells. Control circuitry 124 is provided to manage data storage and retrieval from the array in response to control signals 140 from the processor. Address circuitry 126, X-decoder 128 and Y-decoder 130 analyze address signals 142 and storage access locations of the array. Sense circuitry 132 is used to read data from the array and couple output data to I/O circuitry 134. The I/O circuitry operates in a bi-directional manner to receive data from processor 110 and pass this data to array 112. It is noted that the sense circuitry may not be used in some embodiments to store the input data.

Dynamic memories are well known, and those skilled in the art will appreciate the that the above-described ROM embedded DRAM has been simplified to provide a basic understanding of DRAM technology and is not intended to describe all of the features of a DRAM. The present invention uses the basic architecture and fabrication techniques of a DRAM and provides an embedded ROM array for non-volatile storage of data. This data can be used to store boot-type data for a system, a non-volatile look-up table, or other data that does not require a dedicated ROM memory device. Embedding ROM storage in a DRAM is most economically beneficial if the DRAM is not substantially altered during fabrication or operation. That is, small fabrication changes allow the embedded memory to be fabricated using known techniques. Further, it is desired to maintain operation of the memory in a manner that is externally transparent. As such, an external processor, or system, does not need special protocol to interface with the embedded memory.

ROM embedded DRAMs provide non-volatile ROM cells that are fabricated using basic DRAM cells that have been slightly modified to hard program the ROM. Some embodiments allow the ROM to be programmed to either a logic one or logic zero. These embodiments can include techniques to short the DRAM capacitor to either a Vcc or Vss connection. For example, U.S. Pat. No. 6,134,137 entitled "ROM-Embedded-DRAM" describes a memory that shorts a DRAM cell electrode to wordlines to program ROM cells. These techniques provide both data logic choices for the ROM cells. The memory reads the ROM cells in a manner that is identical to reading the DRAM cells. As described below, the present invention provides an improved ROM embedded DRAM.

Alternate ROM programming techniques can be implemented that allow ROM cells to be hard programmed using DRAM cells. These techniques, however, allow the memory cell to be programmed to one logic state only. That is, ROM cells can be programmed to a logic one or a logic zero, but both options are not available in the same memory. If a memory is limited, for example, to programming logic zero ROM cells, unprogrammed ROM cells must be read as logic ones. Similarly, in a memory limited to programming logic one ROM cells, unprogrammed ROM cells must be read as logic zeros.

The present invention provides several embodiments that allow unprogrammed ROM cells to be read accurately. In a first embodiment, the sense amplifiers of the ROM memory cells are biased to read marginal or no differences between complimentary digit lines in a predefined manner. The sense amplifier bias technique is described below and with reference to U.S. Pat. No. 6,075,737 entitled "Row Decoded Biasing of Sense Amplifier for improved One's Margin."

Figure 2:
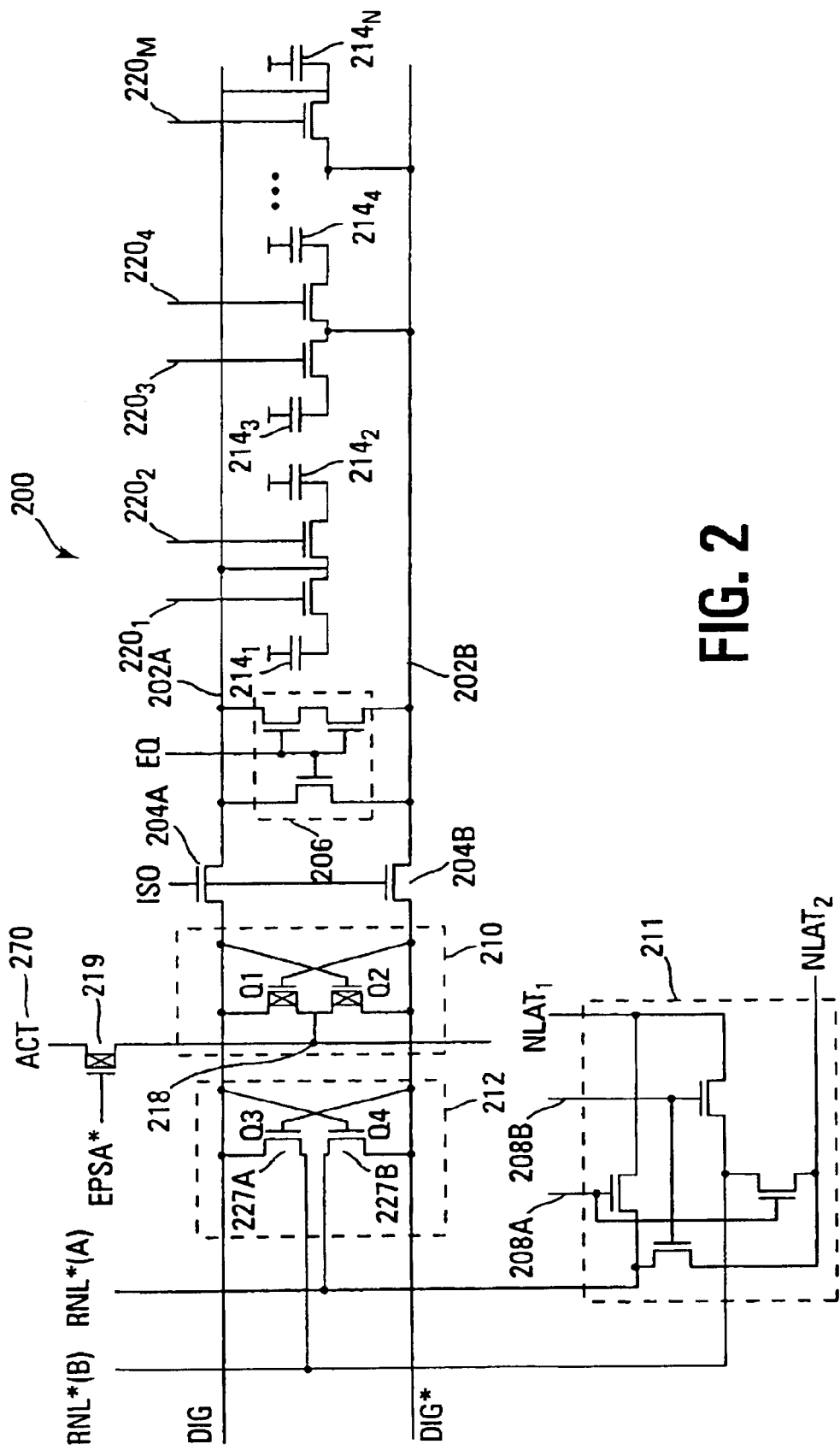
FIG. 2 illustrates a pair of complementary digit lines of an embodiment of the memory of FIG. 1.

FIG. 2 illustrates a pair of complementary digit lines, or bit lines 202A and 202B respectively. Specifically, FIG. 2 is a schematic diagram illustrating a detailed portion of a sense amplifier circuit and related auxiliary connection circuitry. The schematic 200 includes an illustration of devices for digit line equilibration shown collectively as 206, a p-sense amplifier 210, as well as an n-sense amplifier 212. The p-sense amplifier 210 includes a pair of cross-coupled p-channel transistors, Q1 and Q2 respectively. A first common node 218 is coupled to the pair of p-channel transistors Q1 and Q2. In one embodiment, common node 218 includes electrical coupling to an active pull-up (ACT) 270 or power voltage supply node through an enable p-sense amplifier (EPSA*) transistor 219. In one embodiment, the ACT 270 couples a Vcc voltage supply to the common node 218. In another embodiment, ACT 270 couples a different bias to common node 218.

The n-sense amplifier 212 includes a pair of cross-coupled n-channel transistors, Q3 and Q4 respectively. The n-sense amplifier 212 and the p-sense amplifier 210 are further coupled to a complementary pair of bit lines, or digit lines 202A and 202B. ROM memory cells, $214_1, \ldots, 214_N$, etc., located at the intersection of digit lines 202A and 202B and wordlines $220_1, \ldots, 220_M$. Each n-channel transistor, Q3 and Q4, of the n-sense amplifier is independently coupled to an n-sense amplifier bus line, RNL*A and RNL*B respectively. In operation, the n-sense amplifier bus lines, RNL*A and RNL*B, couple each n-channel transistor, Q3 and Q4, to an n-sense amplifier latch signal, $NLAT_1$ and $NLAT_2$.

The coupling of the $NLAT_1$ and $NLAT_2$ to each n-channel transistor, Q3 and Q4 is controlled by series of gate transistors shown collectively as 211. In one embodiment, the gate transistors are operated by bias, 208A and 208B. The bias signals 208A and 208B are applied in the alternative. Applying bias 208A couples $NLAT_1$ to RNL*A and $NLAT_2$ to RNL*B. Applying bias 208B has the opposite resultant effect. In one embodiment, $NLAT_1$ is at a potential of Vcc/2 (or DVC2) and $NLAT_2$ is at a potential of Vcc/2+ (or DVC2+), slightly greater than DVC2. In one embodiment, DVC2+ is approximately 50 millivolts (mV) higher than the potential of DVC2. These potentials are placed on the respective n-sense amplifier bus lines, RNL*A or RNL*B depending on which bias, 208A or 208B, is selected. Thus, NLAT is at a potential of DVC2 and $NLAT_2$ is at a potential of DVC2+ when bias 208A is chosen. N-sense amplifier bus lines, RNL* is biased to DVC2 and RNL*B is biased to DVC2+. ACT 270 meanwhile is biased to Vss or signal ground. The digit lines are both initially equilibrated at Vcc/2. Thus, the n-sense amplifier transistors and p-sense amplifier transistors are off. When the memory cell is accessed, a signal develops across the complementary digit line pair. While one digit line contains charge from the cell accessed, the other digit line does not and serves as a reference for the sensing operation.

In operation, the n-sense amplifier is fired by bringing, $NLAT_1$ and $NLAT_2$, toward ground. As the voltage difference between $NLAT_1$ and the reference digit line, and between $NLAT_2$ and digit line and approaches Vt, the n-channel transistor whose gate is connected to the higher voltage digit line begins to conduct. This conduction is further assisted, however, by the fact that $NLAT_1$ with the DVC2 bias pulls to ground more quickly, reaching that transistor's saturation conduction region more rapidly. Thus, even if the signal difference across the complementary digit line pair is not very clear or distinguishable, one of the n-channel transistors is biased to turn on more quickly, favoring a logical "1" read. The remainder of the sensing operation occurs as known to those skilled in the art. The conduction of the n-channel transistor causes the low-voltage digit line to be discharged toward the NLAT* voltage. Ultimately, NLAT* reaches ground, and the digit line is brought to ground potential. The p-sense amplifier is next fired and the ACT 270 is brought toward Vcc in complementary fashion to the n-sense amplifier. With the low-voltage digit line approaching ground, there is a strong signal to drive the appropriate p-channel transistor into conduction.

In an embodiment of the present invention, ROM cells 214 are programmed to one logic state, but not the other. That is, all ROM cells can be programmed to logic ones and not logic zeros. In the alternative, all ROM cells can be programmed to logic zeros and not logic ones. The sense amplifier circuitry 210/212 is biased to sense the unprogrammed ROM cells as a specific data state. In one embodiment, the sense amplifiers are biased to pull the active digit line high in the absence of a programmed "zero" memory cell. In the alternate embodiment, the sense amplifiers are biased to pull the reference digit line high in the absence of a programmed "one" memory cell on the active digit line.

The present invention is not limited to the bias circuit described above, but can be any biasing technique which allows the sense amplifier circuitry to favor one data state when the digit lines have a small, or zero, differential voltage. For example, the p-sense amplifier circuit can be biased. Further, both the p-sense and n-sense amplifier circuitry can be biased. In memory devices that use sense circuitry, which differs from the cross-couple circuit described, further biasing circuitry can be used.

The present invention allows an embedded ROM to be fabricated in a DRAM, while programming the ROM cells using only one data state. The above-described embodiment biases the sense amplifier circuitry to accurately read un-programmed memory cells. In other embodiments, digit line voltages are biased using reference memory cells to reliably sense un-programmed ROM cells, as described below.

Figure 3:
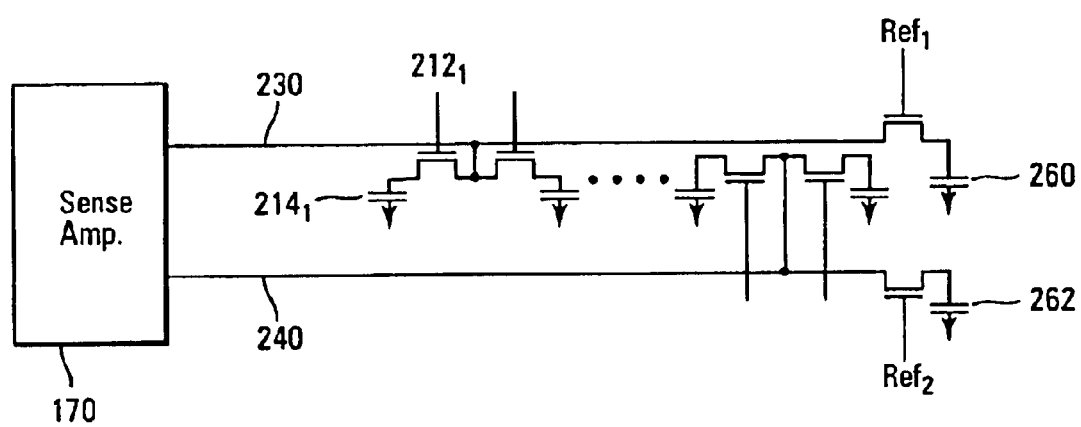
FIG. 3 illustrates a pair of complementary digit lines and reference cells of another embodiment of the memory of FIG. 1.

Referring to FIG. 3, a portion of a ROM array is described. The array includes a pair of digit lines 230 and 240 coupled to a differential voltage sense amplifier circuit 250. Each digit line can be selectively coupled to reference memory cells 260 and 262 to provide a differential between the digit lines. In one embodiment, a reference cell 260 is coupled to the active digit line 230 to bias the digit line toward the un-programmed state. In a complementary embodiment, reference cell 262 is coupled to the reference digit line 240 to bias the reference digit line toward a programmed cell state. The reference cells can be ROM cells coupled to an intermediate voltage level X, such that ½ Vcc<X<Vcc, or Vss<X<½ Vcc. Alternatively, the reference cells can be DRAM capacitor cells that contain an appropriate charge that moves its corresponding digit line voltage.

Figure 4:
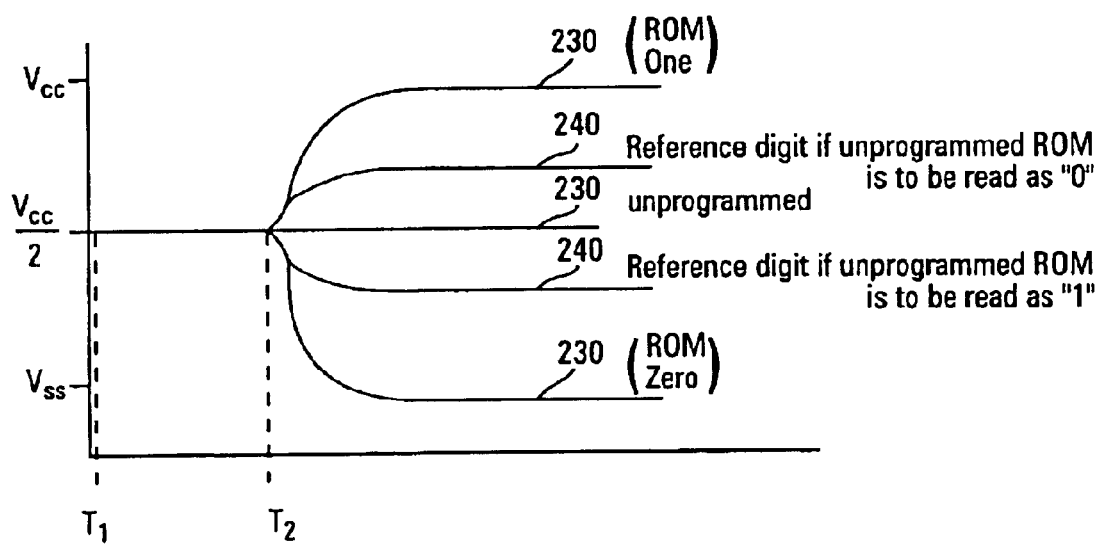
FIG. 4 is a simplified timing diagram of operation of an embodiment of the memory of FIG. 3.

As illustrated in the timing diagram of FIG. 4, at time T1 the bit lines 230 and 240 are equilibrated to ½ Vcc. At time T2, the memory cell wordline $212_1$ is activated. At the same time, the reference wordline, $Ref_2$, is activated to couple the reference cell to the reference digit line 240. If the ROM cell is un-programmed the active digit line remains substantially at ½ Vcc and the reference digit line voltage is either increased or decreased, depending on the ROM program option for the memory. If the ROM cell is programmed, the active digit line is pulled to either Vcc or Vss, depending upon the ROM program option for the memory.

Figure 5:
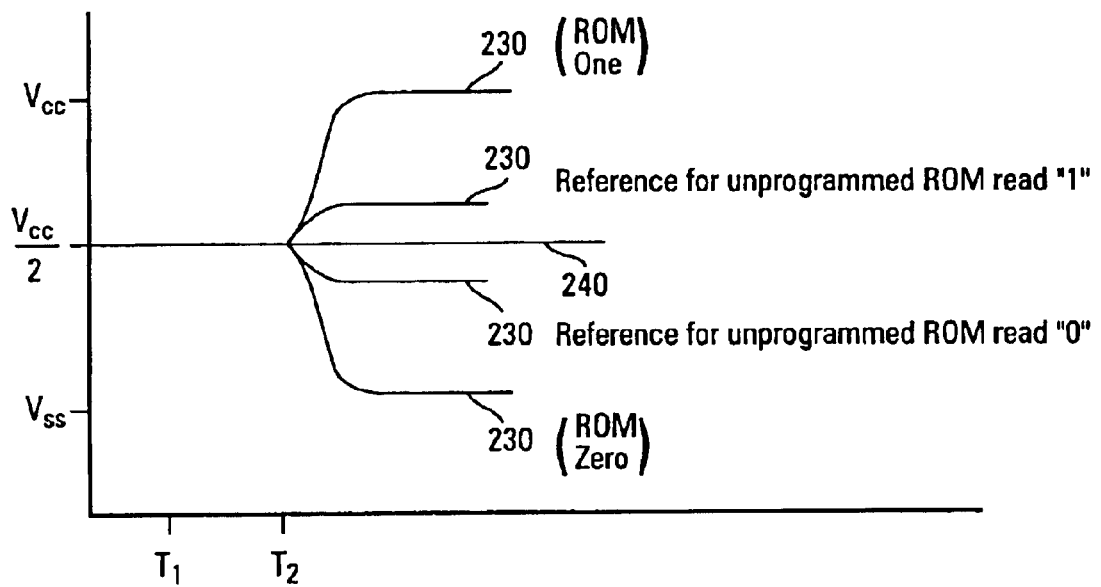
FIG. 5 is another simplified timing diagram of operation of an embodiment of the memory of FIG. 3.

As illustrated in the timing diagram of FIG. 5, at time T1 the bit lines are equilibrated to ½ Vcc. At time T2, the memory cell wordline $212_1$ is activated. At the same time, the reference wordline, $Ref_1$, is activated to couple the reference cell to the active digit line 230. If the ROM cell is un-programmed the active digit line is either increased or decreased, depending on the ROM program option for the memory, and the reference digit line voltage remains substantially at ½ Vcc. If the ROM cell is programmed, the active digit line is pulled to either Vcc or Vss, depending upon the ROM program option for the memory.

It will be appreciated by those skilled in the art, with the benefit of the present disclosure, that activating the ROM cell and the reference cell simultaneously can result in increased power consumption. As such, it may be beneficial to precharge the digit lines to a differential state prior to activating the ROM wordline. In this embodiment, the differential voltage remains present if the ROM cell is unprogrammed. If the ROM cell is programmed, the differential voltage is driven hard in the opposite direction.

Figure 6:
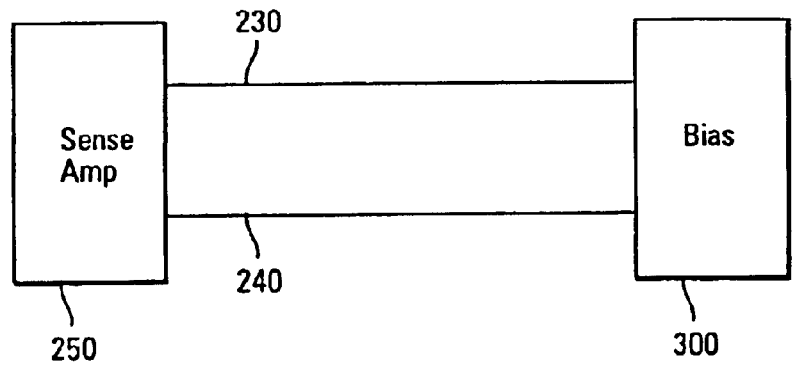
FIG. 6 illustrates a pair of complementary digit lines and bias circuitry of an embodiment of the memory of FIG. 1.
Figure 7:
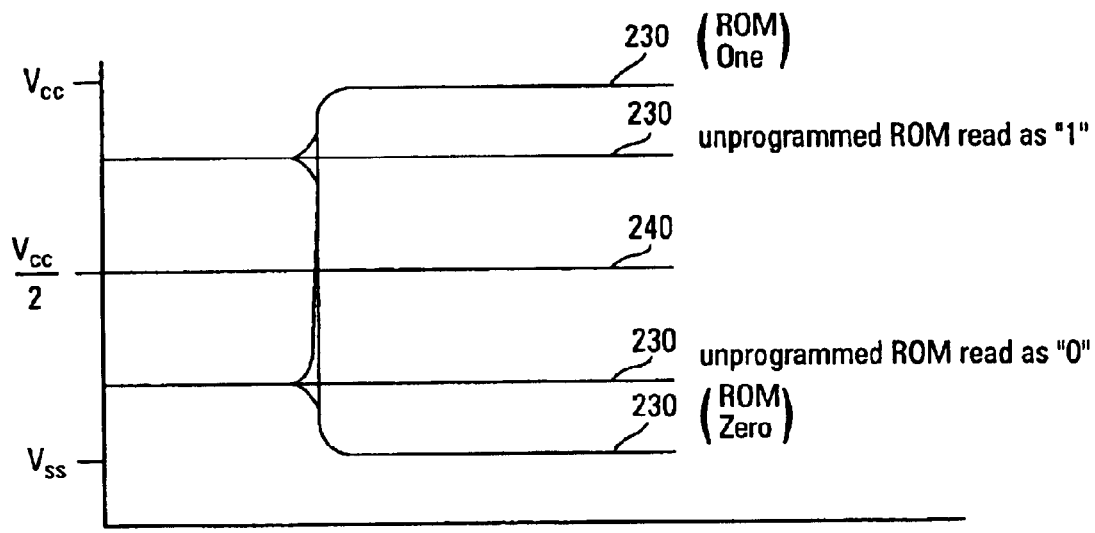
FIG. 7 is a simplified timing diagram of operation of an embodiment of the memory of FIG. 6.

In operation of this embodiment, a bias circuit 300 is activated prior to activating the ROM cell wordline, see FIGS. 6 and 7. The reference digit line is pre-charged to a mid-level such as ½ Vcc and the active digit line is charged to less than or equal to Vcc, but greater than ½ Vcc, prior to activating the wordline. If the cell is programmed, the active digit line is discharge to ground. Alternatively, the active digit line is pre-charged to a mid-level such as ½ Vcc and the reference digit line is charged to less than or equal to Vcc, but greater than ½ Vcc, prior to activating the wordline. If the cell is programmed to a one, the active digit line is charged to Vcc. The remaining differential combinations can be appreciated from the present disclosure.

Figure 8:
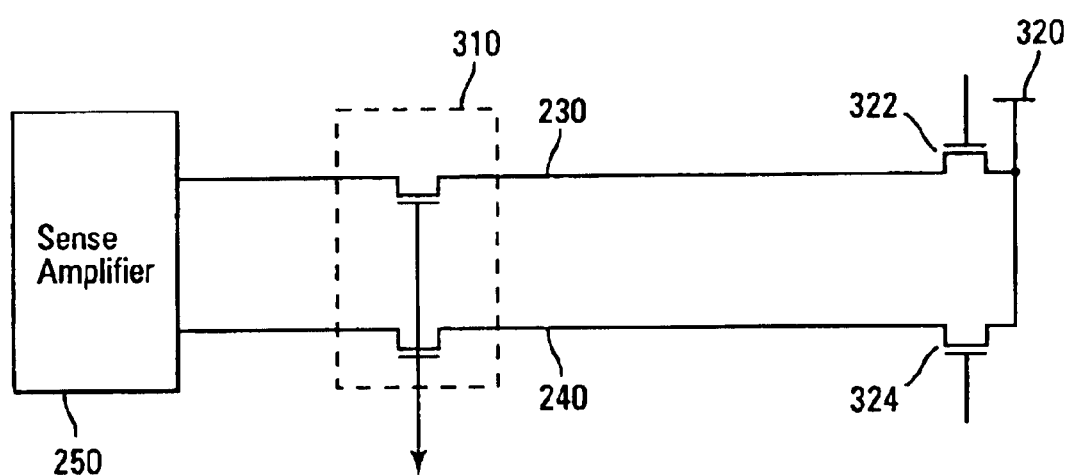
FIG. 8 illustrates a pair of complementary digit lines and with isolated sense amplifier of an embodiment of the memory of FIG. 1.

In another embodiment, the DRAM can be fabricated to provide ROM cells that are disconnected from digit line sense amplifiers. Referring to FIG. 8, isolation circuitry 310 is provided between the digit lines 230 and 240 and the sense amplifier circuitry 250. The isolation circuitry can be provided in both the ROM and DRAM arrays; however, the isolation circuitry is activated during operation of the ROM. The digit lines of the ROM are selectively coupled to a voltage bias source via switches 322 and 324. The voltage bias source is selected based upon the programmable state of the ROM cells. For example, the digit lines can be coupled to Vcc when the ROM cells are programmable to a zero state, Vss. Alternatively, the digit lines can be coupled to Vss when the ROM cells are programmable to a one state, Vcc. The switch circuitry 322 and 324 that selectively couples the digit lines to the voltage bias can be transistors. The transistors may be long-L transistors that limit the current conducted when a hard programmed ROM cell is read. During operation, the voltage bias circuit couples the active digit line to either Vcc or Vss. When the wordline is activated, a hard programmed ROM cell couples the digit line to Vss or Vcc and overpowers the bias circuitry. Thus, the bias circuitry establishes a default voltage that remains present on the digit lines when an unprogrammed ROM cell is read, but overpowered when a programmed ROM cell is read.

The above described bias techniques can be used on any ROM embedded DRAM, or non-volatile memory cells configured to operate in a traditional DRAM manner. The ROM cells are programmable to only one state and the bias technique is used to accurately "read" unprogrammed cells. The manner in which the ROM cells are programmed is not critical to the present invention. One technique for physically programming ROM embedded cells is described in U.S. Pat. No. 6,134,137 issued Oct. 17, 2000 entitled "ROM-Embedded-DRAM", incorporated herein by reference. Other techniques for hard programming an embedded ROM cell include, but are not limited to, removing the cell capacitor dielectric layer and coupling to a program voltage, providing a high current leakage path for the cell capacitor storage node, and shorting the cell capacitor plates, using a fabricated conductor or an anti-fuse short, to a program voltage.

CONCLUSION

A ROM embedded DRAM has been described that provides ROM cells that can be programmed to a single state. Bias techniques have been described to read un-programmed ROM cells accurately. As described, sense amplifier circuitry can be offset in one embodiment to default to the un-programmed state. In another embodiment, bias circuitry is coupled to bit lines to favor the un-programmed state. A differential pre-charge operation can also be used in another embodiment.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of reading a read-only memory (ROM) cell comprising:

coupling a ROM cell to a first digit line;

coupling a reference cell to the first digit line; and comparing a voltage of the first digit line to a voltage of a second digit line.

2. The method of claim 1, wherein the reference cell is a ROM cell.

3. The method of claim 1, wherein:

the ROM cell is a DRAM capacitor cell hard programmed in a non-volatile manner to a first voltage level; and wherein hard programming is accomplished;

using an electrical potential to short a dielectric layer of the ROM cell, using a physical conductor fabricated between capacitor plates of the ROM cell, using a high leakage path from a storage node of the ROM cell, or using a physical short between a storage node of the ROM cell to receive a voltage signal.

4. The method of claim 1, wherein comparing comprises:

coupling the reference cell to sense circuitry to force a detection of a second data state in an absence of a programmed memory cell capacitor coupled to the digit lines.

5. The method of claim 1, wherein the reference cell is a DRAM capacitor cell containing an appropriate charge to bias the first digit line toward a programmed cell state.

6. The method of claim 1, and further comprising:

precharging the first digit line to a first voltage level; and precharging the second digit line to a second voltage level.

7. A method of reading a read-only memory (ROM) cell comprising:

coupling a first ROM cell to a first digit line;

coupling a second ROM cell to the first digit line; and comparing a voltage of the first digit line to a voltage of a second digit line.

8. The method of claim 7, wherein the first ROM cell is a DRAM capacitor cell hard programmed in a non-volatile manner to a first voltage level.

9. The method of claim 8, wherein hard programming is accomplished:

using an electrical potential to short a dielectric layer of the ROM cell, using a physical conductor fabricated between capacitor plates of the ROM cell, using a high leakage path from a storage node of the ROM cell, or using a physical short between a storage node of the ROM cell to receive a voltage signal.

10. The method of claim 7, wherein comparing comprises:

coupling the second ROM cell to sense circuitry to force a detection of a second data state in an absence of a programmed memory cell capacitor coupled to the digit lines.

* * * * *